United States Patent [19]
Ramirez

[11] Patent Number: 5,982,815
[45] Date of Patent: Nov. 9, 1999

[54] CIRCUIT FOR SETTING A DEVICE INTO A TEST MODE BY CHANGING A FIRST PORT TO A FIXED CLOCK AND A SECOND PORT TO A NON-FIXED CLOCK

[75] Inventor: Sergio R. Ramirez, Austin, Tex.

[73] Assignee: Advanced Micro Devices Inc., Sunnyvale, Calif.

[21] Appl. No.: 08/675,297

[22] Filed: Jul. 1, 1996

[51] Int. Cl.⁶ .............................. H04B 3/46; H04B 17/00; H04Q 1/22
[52] U.S. Cl. .................... 375/224; 324/527; 340/825.65; 364/569; 364/579; 371/22.1
[58] Field of Search .................................... 375/224, 228, 375/242; 395/500, 527, 385, 568; 379/412; 324/500, 512, 520, 521, 527, 532, 535, 537, 750, 754, 755, 756, 761, 763; 371/22.1, 22.6, 22.5; 340/825.25, 825.7, 825.71, 825.16, 825.57, 825.65, 825.62, 825.67; 364/569, 579, 580, 550

[56] References Cited

U.S. PATENT DOCUMENTS

| | | | |
|---|---|---|---|
| 3,916,381 | 10/1975 | Johnson, III et al. | 340/150 |
| 4,714,876 | 12/1987 | Gay et al. | 324/73 R |
| 4,860,332 | 8/1989 | Chism | 379/1 |
| 4,914,379 | 4/1990 | Maeno | 371/22.3 |
| 5,019,772 | 5/1991 | Dreibelbis et al. | 324/158 R |
| 5,161,159 | 11/1992 | McCure et al. | 371/22.1 |
| 5,412,633 | 5/1995 | Kromer et al. | 371/22.1 |
| 5,495,513 | 2/1996 | Ramirez et al. | 377/111 |
| 5,636,273 | 6/1997 | Schopfer et al. | 379/412 |
| 5,638,440 | 6/1997 | Nix et al. | 379/412 |
| 5,640,451 | 6/1997 | Schopfer | 379/412 |

FOREIGN PATENT DOCUMENTS

| | | | |
|---|---|---|---|
| 0471541 | 2/1992 | European Pat. Off. | G11C 29/00 |
| 02311061 | 12/1990 | Japan | H04M 3/30 |
| 2049206 | 12/1980 | United Kingdom | G01R 31/28 |

OTHER PUBLICATIONS

Miyaji, et al. A Multibit Test Trigger Circuit for Megabit SRAM's, 8107 IEEE Journal of Solid–State Circuits 25 (Feb. 1990), No. 1, New York, US.

Chardon et al. Axe 10 Numerique: Raccordement D'Abonnes Analogiquies, 316 Commutation & Transmission 11 (1989) No. 4, Paris, FR, pp. 67–74.

Primary Examiner—Chi H. Pham
Assistant Examiner—William Luther
Attorney, Agent, or Firm—Foley & Lardner

[57] ABSTRACT

An apparatus for setting a device into a test mode. The apparatus has a first input port for receiving a fixed, constant signal during a normal mode of the device, and for receiving a non-fixed, clocked signal so as to set the device into a test mode. The apparatus also has a second input port for receiving a non-fixed, clocked signal during the normal mode and for receiving a fixed, constant signal so as to set the device into the test mode. When both the first input port receives the non-fixed, clocked signal and the second input port receives the fixed, constant signal for a predetermined amount of time, the device is placed into the test mode.

14 Claims, 4 Drawing Sheets

CIRCUIT FOR SETTING A DEVICE INTO A TEST MODE BY CHANGING A FIRST PORT TO A FIXED CLOCK AND A SECOND PORT TO A NON-FIXED CLOCK

BACKGROUND OF THE INVENTION

1. Field of the Invention

The invention relates to an apparatus and method for placing a device into a test mode. In particular, the invention relates to an apparatus and method for placing a quad subscriber line audio processing circuit (QSLAC) into a test mode by inverting the functions of two pins for that device.

2. Description of the Related Art

Various methods have been devised to place different kinds of devices into a test mode. Generally, these methods involve utilizing "test signal" inputs to the devices in order to invoke the test mode.

One type of device that is commonly placed into a test mode is a subscriber line audio processing circuit (SLAC), or a quad SLAC (QSLAC). A SLAC or QSLAC is used with telephones, and it handles analog-to-digital signal conversion, filtering, and interfacing with a pulse code modulation (PCM) highway. Such devices are described, for example, in "Integrated Ring Detection Circuit and Power Cross Detection Circuit With Persistence Timers", U.S. Pat. No. 5,636,273, invented by W. Schopfer, and assigned to AMD Inc., which is incorporated herein by reference.

In order to place a SLAC or QSLAC into a test mode, a test signal that is connected to a test input pad is set to an active state. However, such a method of setting the device into the test mode is prone to problems, in that an inadvertent setting of the test input pad into the active state would place the device into the test mode when the normal mode is desired.

Testing is an integral part of a design process for a VLSI circuit, such as a SLAC or a QSLAC. Testing should be accommodated with primary design functionalities in order to insure proper device operation. In order to achieve these testing goals, a device under test is often programmed to enter one or more modes in which the operation of one or more of the device's sections is evaluated. Once the device is in a particular test mode, a predefined sub-section is exercised and all important signals corresponding to this sub-section of the device are brought out to the external pins for observation. A test mode thus allows one to debug and verify a sub-block or one of the functionalities of the device. Normally, a device may enter several test modes. Different functionalities are individually addressed in each of these test modes. Depending upon a particular test mode selected, the functionality of the device may change. The pin-mapping of the device may also change, causing the function behavior and desired performance characteristics of various pins to change.

Accommodating all such test requirements without changing the normal operation of the device requires programming the device in the test mode. Entering the test mode requires communication with the device. If the device is an externally programmable part, test engineering can program the device to enter the test mode and conduct the required testing. Commands to execute testing can be provided through pins available for external programming. The end user, however, is often not provided this information so as not to enter the test mode.

When the part is not externally programmable, there is no predefined communication channel through which test engineering can communicate with the device. The functional description and the behavior of each pin is pre-characterized and cannot be altered to insert the test mode. In such a case, another option is to visit each pin on the device, and use a pin strapping technique on an available pin to control the operational mode of the device. In pin strapping, an external input pin, not used otherwise, is either tied to VCC or GND. Depending upon which voltage supply the pin is tied to, the device can be guided to operate either in a test mode or a normal operating mode. However, this method requires that a pin be available for strapping. Hence, the device is either programmable or has some external pin available for the test mode entry.

It is desirable to provide a scheme for placing such a device, and other types of devices, into a test mode without needing to add new test ports for the device.

SUMMARY OF THE INVENTION

It is an object of the invention to allow setting a device, such as a SLAC or a QSLAC, into a test mode using only the standard input ports for that device.

This and other objects may be obtained by a circuit for setting a device into a test mode. The circuit receives a first bi-mode signal which is in a fixed state to set and maintain a normal, non-test mode of the device and which is in a non-fixed clocked state so as to enter a test mode of the device. The circuit also receives a second bi-mode signal which is in the non-fixed clocked state to set and maintain the normal mode and which is in the fixed state so as to enter the test mode. The circuit includes a first port for receiving the first bi-mode signal. The circuit also includes a second port for receiving the second bi-mode signal. The circuit further includes circuitry, for example, a pair of flip-flops, such as D-type flip-flops, connected to the first and second ports and configured to determine that the first bi-mode signal has been in the non-fixed clock state for at least a predetermined number of clock cycles while the second bi-mode signal has been in the fixed state and for outputting a test signal as a result thereof. The device enters the test mode in response to the test signal.

The above-described object and other objects are also obtained by a circuit for setting a device into a test mode. The circuit receives a first bi-mode signal which is in a fixed state to set and maintain a normal, non-test mode of the device and which is in a non-fixed clocked state so as to enter a test mode of the device. The circuit also receives a second bi-mode signal which is in the non-fixed clocked state to set and maintain the normal mode and which is in the fixed state so as to enter the test mode. The circuit includes a first port for receiving the first bi-mode signal. The circuit also includes a second port for receiving the second bi-mode signal. The circuit further includes means for determining that the first bi-mode signal has been in the non-fixed clock state for at least a predetermined number of clock cycles while the second bi-mode signal has been in the fixed state and for outputting a test signal as a result thereof. The device is placed in the test mode in response to the test signal.

The above-mentioned object and other objects are also obtained by a method for setting a device into a test mode. The method includes a step of receiving a first bi-mode signal which is in a fixed state to set and maintain a normal, non-test mode of the device and which is in a non-fixed clocked state so as to enter a test mode of the device. The method also includes a step of receiving a second bi-mode signal which is in the non-fixed clocked state to set and maintain the normal mode and which is in the fixed state so as to enter the test mode. The method further includes a step of detecting that the first bi-mode signal is in the non-fixed clocked state for at least a fixed number of clock periods. The method still further includes a step of detecting that the second bi-mode signal is in the fixed state at all times while the first bi-mode signal is in the non-fixed clocked state for at least the fixed number of clock periods. According to the method, the device is set into the test mode when the first bi-mode signal is detected to be in the non-fixed clocked state for at least the fixed number of clock periods and the second bi-mode signal is in the non-fixed clocked state during the same period of time.

BRIEF DESCRIPTION OF THE DRAWINGS

These and other objects and advantages of the invention will become more apparent from the following detailed description when read in conjunction with the accompanying drawings, with like reference numerals indicating corresponding parts throughout, wherein.

DETAILED DESCRIPTION OF THE PREFERRED EMBODIMENTS

Figure 1A:
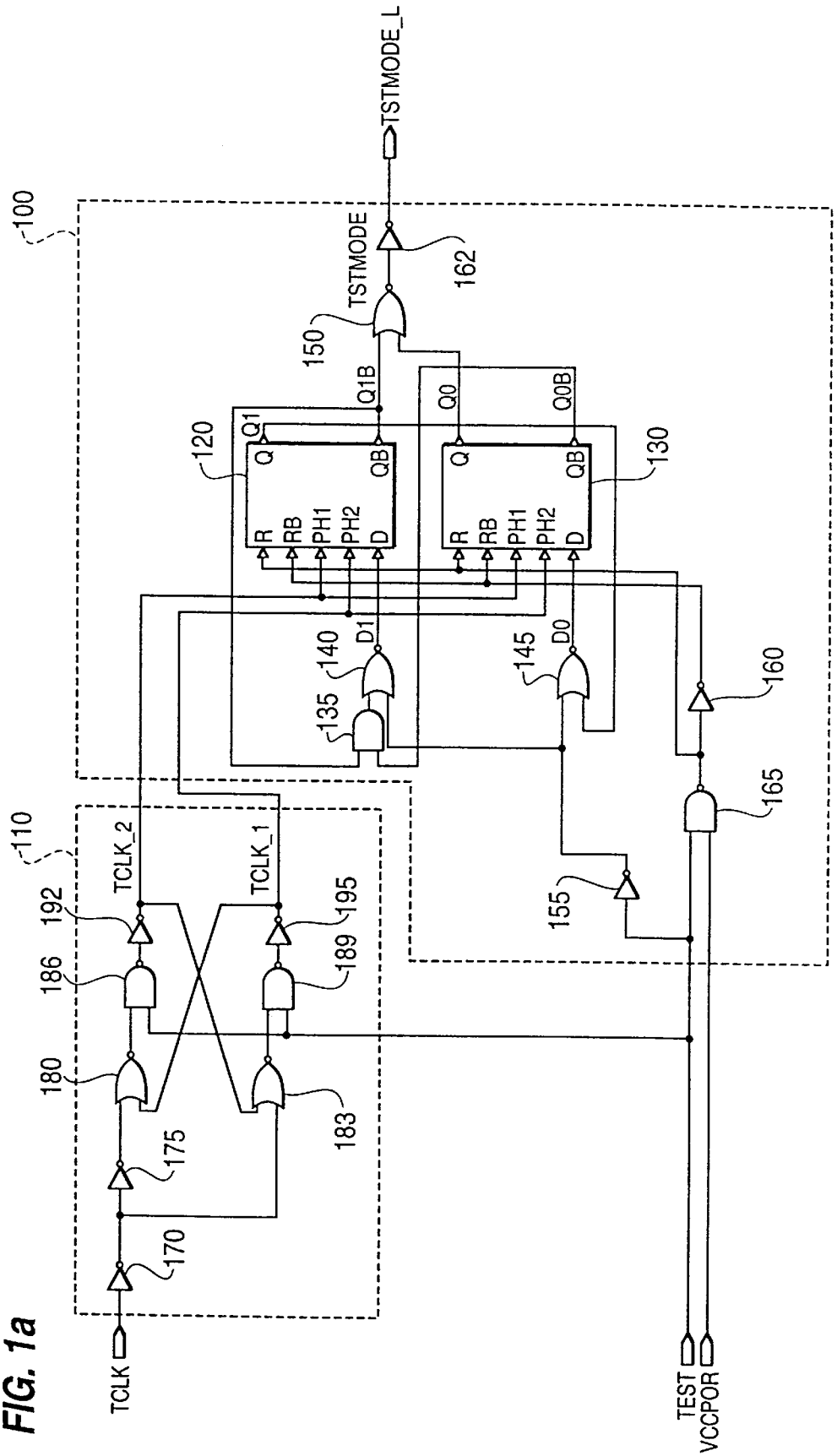
FIG. 1a is a block diagram of the test detection circuit according to a first embodiment of the invention.

A test detection circuit according to a first embodiment of the invention is shown in FIG. 1a. The test detection circuit includes a state machine 100 and a test clock generation circuit 110. The state machine 100 includes a first D-type flip-flop 120, a second D-type flip-flop 130, an AND gate 135, a first NOR gate 140, a second NOR gate 145, a third NOR gate 150, a first inverter 155, a second inverter 160, a third inverter 162, and a NAND gate 165. The test clock generation circuit 110 includes a first inverter 170, a second inverter 175, a first NOR gate 180, a second NOR gate 183, a first NAND gate 186, a second NAND gate 189, a third inverter 192 and a fourth inverter 195.

The test clock generation circuit 110 receives a test clock input signal TCLK, and outputs a first test clock signal TCLK_1 and a second test clock signal TCLK_2, which are respectively indicative of first and second phase, non-overlapping pulses of the test clock input signal TCLK. The first and second test clock signals TCLK_1 and TCLK_2 are respectively received at first and second phase clock inputs PH1, PH2 of the first and second D-type flip-flops 120, 130. The state machine 100 also receives a test signal TEST and a VCCPOR signal. The VCCPOR signal is used as a reset signal for the test detection circuit when in an active high state.

Figure 1B:
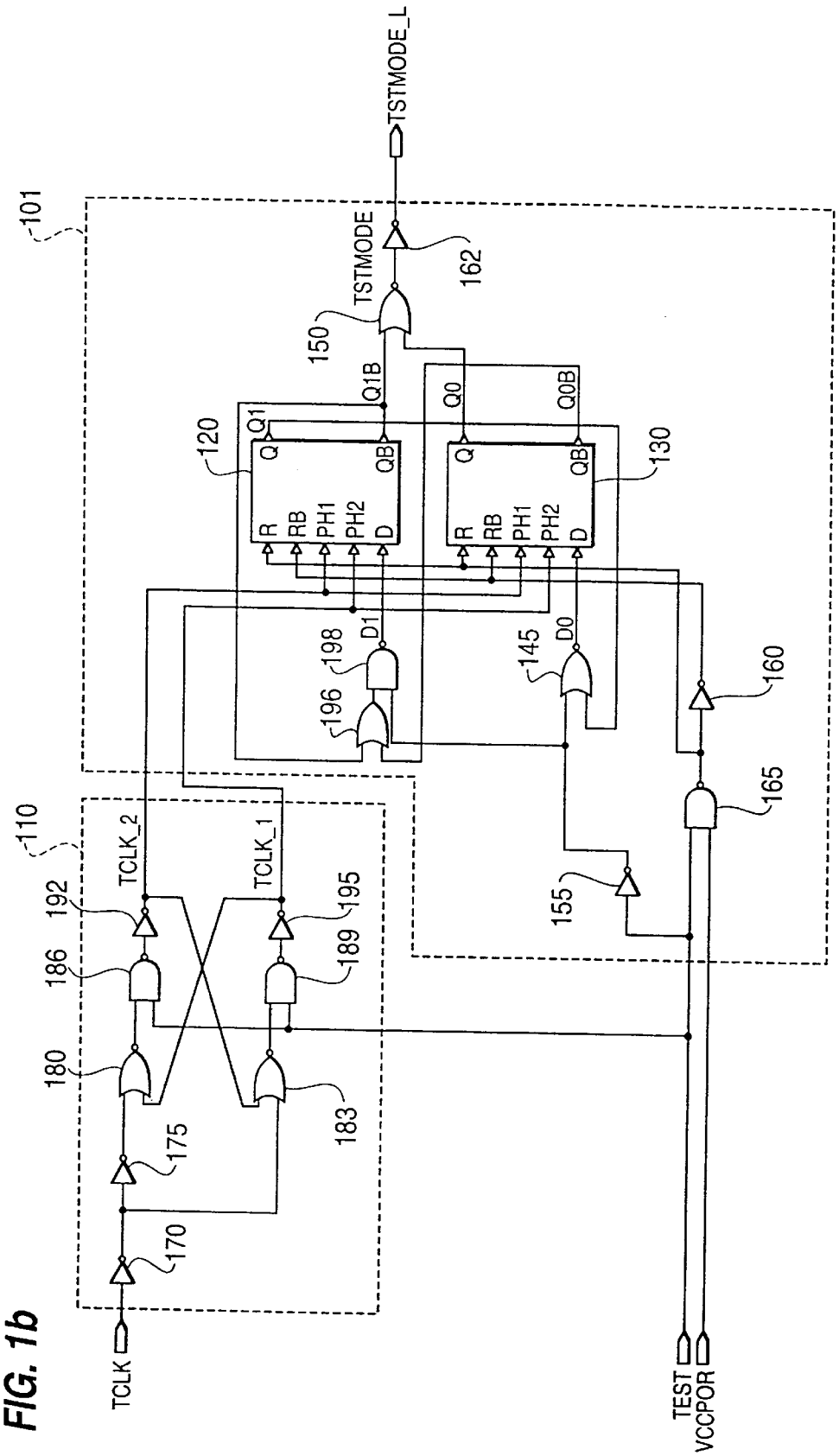
FIG. 1b is a block diagram of the test detection circuit according to a second embodiment of the invention.

The state machine 100 asserts the signal TM when: a) TEST is high, b) VCCPOR is high, and c) TCLK is clocked three successive times while conditions a) and b) are simultaneously maintained. In the first embodiment as shown in FIG. 1a, the D-type flip-flops 120, 130 are positive-edge triggered (PH1) devices, but the invention could work equally as well with negative-edge triggered devices. FIG. 1b shows a second embodiment of the invention, with the test generation circuit 110 and a state machine 101. State machine 101 is similar to state machine 100 of FIG. 1, except that a third NOR gate 196 replaces the AND gate 135, and a second NAND gate 198 replaces the first NOR gate 140. State machine 101 works exactly the same as state machine 100 to achieve the state transitions of FIG. 2.

In the system according to the invention, in order to invoke the test mode, a first pin which normally receives a fixed (ALAW_ULAW) signal at a fixed, non-toggle state, instead receives a clocked, toggle (TCLK) signal, while a second pin which normally receives a clocked (FRAMESYNC) signal, instead receives a fixed, non-toggle (TEST) signal. After a plurality of successive high-to-low (or low-to-high) transitions of the signal input to the first pin while the signal to the second pin is maintained at a fixed, constant state, the device enters a test mode. Once in the test mode, the device remains in the test mode until either: a) reset is activated (via the VCCPOR signal), or b) the input to the second pin toggles (i.e., returns to a clocked state) for a fixed number of pulses (for example, three pulses).

In the preferred embodiment, the number of pulses received by the first pin while the second pin receives a fixed signal so as to enter the test mode is three, but this value can be changed to any other positive integer value, while keeping within the scope of the invention. Similarly, the number of pulses received by the second pin while in the test mode in order to exit the test mode may be any positive integer, which may be different than the number of pulses received by the first pin in order to enter the test mode.

Figure 2:
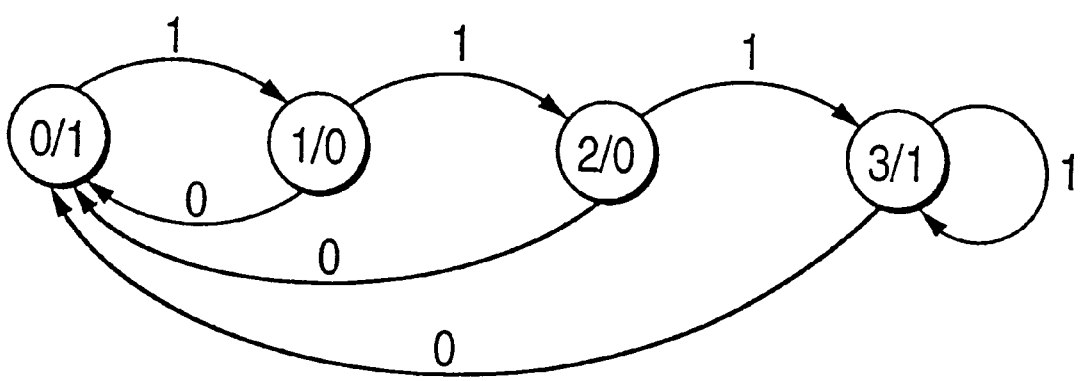
FIG. 2 is a state diagram of the various states of the state machine portion of test detection circuit according to the preferred embodiment of the invention.

FIG. 2 shows a state diagram of the various possible states of the state machine 100 and 101 of FIGS. 1a and 1b, respectively. The state machine 100 or 101 is initially set in the 0/0 state (i.e, at power up, or after a reset), with the first value X of the nomenclature X/Y corresponding to a present state of the state machine 100 or 101, and the second value Y of the nomenclature X/Y corresponding to an output of the state machine 100 or 101. When the input signal TEST is high (i.e., TEST is at a logic one state), the state machine 100 or 101 transitions from the 0/0 state to the 1/0 state. In the 1/0 state, if the state machine 100 or 101 receives another high state of the input signal TEST, the state machine 100 or 101 transitions to the 2/0 state. If, however, the state machine 100 or 101 receives a low state of the input signal TEST when in the 1/0 state, the state machine 100 or 101 transitions back to the 0/0 state.

In the 2/0 state, if the state machine 100 or 101 receives another high state of the input signal TEST, the state machine 100 or 101 transitions to the 3/1 state. That is, the state machine 100 or 101 outputs a test signal with a logic state of "one" to indicate a test state. If, however, the state machine 100 or 101 receives a low state of the input signal TEST when in the 2/0 state, the state machine 100 or 101 transitions back to the 0/0 state.

In the 3/1 state, if the state machine 100 or 101 receives still another high state of the input signal TEST, the state machine 100 or 101 stays in the 3/1 state. If, however, the state machine 100 or 101 receives a low state of the input signal TEST when in the 3/1 state, the state machine 100 or 101 transitions back to the 0/0 state.

The AND gate 135, first NOR gate 140, second NOR gate 145, third NOR gate 150, first inverter 155, second inverter 160, and AND gate 165 of the state machine 100 are used with the first and second D-type flip-flops 120, 130 to obtain the various states and state transitions of the state diagram as shown in FIG. 2. Similarly, the various non-flip-flop components of state machine 101 of FIG. 2 are used with the first and second D-type flip-flops 120, 130 to obtain the various states and state transitions of the state diagram as shown in FIG. 2.

Figure 3:
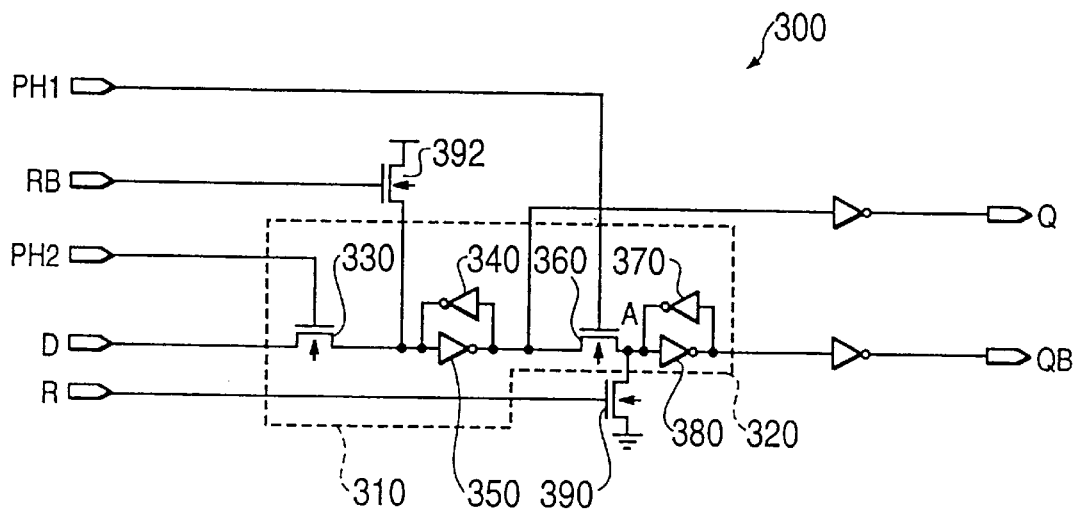
FIG. 3 is a diagram of D-type flip-flops that can be used in the state machine portion of the test detection circuit according to the preferred embodiment of the invention.

FIG. 3 shows a detailed diagram of a D-type flip-flop structure 300 that can be used for either of the D-type flip-flops 120, 130 of the state machine 100 or 101. The structure 300 includes a "master" section 310 and a "slave" section 320. The master section 310 includes a field effect transistor (FET) 330, and a pair of oppositely-connected inverters 340, 350. The pair of oppositely-connected inverters 340, 350 form a first storage means for the structure 300.

The slave section includes a FET 360, and a pair of oppositely-connected inverters 370, 380. The pair of oppositely-connected inverters 370, 380 form a second storage means for the structure 300. The structure 300 also includes a reset FET 390 which receives the reset signal R on its gate terminal, and a reset_B FET 392 which receives the reset_B signal RB on its gate terminal. The reset_B signal RB is opposite in polarity of the reset signal R (i.e., active high signal). The FETs 330, 360 respectively receive the PH2 (TCLK_2) and PH1 (TCLK_1) clock signals at their respective gate terminals.

Of course, other types of D-type flip-flop configurations, as well as other types of flip-flops (i.e., S/R type, J/K type, master-slave type, etc.) can be used in the state machine 100 or 101 and still be within the scope of the invention, as long as the state diagram of FIG. 2 is maintained.

Figure 4:
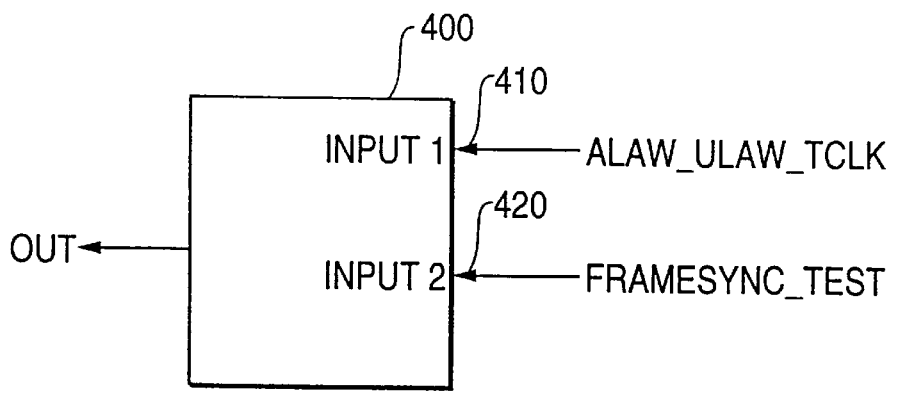
FIG. 4 is a diagram of a device that has a first input port and a second input port for receiving bi-mode signals in order to set the device into and out of a test mode according to the preferred embodiment of the invention.

FIG. 4 shows a device 400 that can set into and out of a test mode according to the invention. In the preferred embodiment, the device is a QSLAC, but it could be any other type of device that has a first port for receiving a constant (i.e., DC) signal in a normal mode and a second port for receiving a clocked signal in the normal mode. The device 400 has a first port 410 which receives a fixed (ALAW_ULAW) signal at a fixed, non-toggle state, during normal (i.e., non-test) operational state (or mode) of the device 400. To place the device 400 in the test mode, the first port 410 instead receives a clocked, toggle (TCLK) signal. The device 400 has a second port 420 which receives a clocked (FRAMESYNC) signal in the normal operational state (or mode) of the device 400. To place the device 400 in the test mode, the second port 420 instead receives a fixed, non-toggle (TEST) signal. After a plurality of successive high-to-low (or low-to-high) transitions of the clocked TCLK signal input to the first port 410 at a same time the second port 420 receives the fixed, constant TEST signal, the device enters a test mode 400. Once in the test mode, the device 400 remains in the test mode until either: a) reset is activated (via the VCCPOR signal), or b) the input signal to the second port 420 toggles (i.e., returns to a clocked state) for a fixed number of pulses (for example, three pulses).

In the normal mode (i.e., non-test mode), the ALAW_ULAW_TCLK signal input to the first port 410 of the device 400 is used to provide a signal used for a-law or μ-law companding for speech signals on the telephone line which the SLAC or QSLAC is connected to. In the test mode, however, the ALAW_ULAW_TCLK signal is used as a test clock signal.

The second port 420 of the device 400 receives the signal FRAMESYNC_TEST, which corresponds to a clocked, frame sync signal used during the normal mode, and a constant, test signal TEST in the test mode.

A frame sync is a signal that synchronizes the data transmission and reception over the same bus. Devices such as SLACs and QSLACs send and receive digital voice data over a bus. This bus is shared by more than one such Q-SLAC or like devices. Based upon the pre-specified time, each channel within a Q-SLAC gains the control of the bus and transmits data during its time slot. These time slots are referenced to frame sync signals. Further details of the use of frame sync signals with SLACs and QSLACs is not important to an understanding of the invention as described herein.

While there have been illustrated and described what is at present considered to be an exemplary embodiment according to the invention, it will be understood by those skilled in the art that various changes and modifications may be made, and equivalents may be substituted for elements thereof without departing from the true scope of the invention. In addition, many modifications may be made to adapt to a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A circuit for setting a device into a test mode, comprising:

a first port for receiving a first bi-mode signal, the first bi-mode signal being set to a fixed state during a normal, non-test mode of the device, the first bi-mode signal being set to a non-fixed clocked state so as to enter and remain in a test; mode of the device;

a second port for receiving the second bi-mode signal, the second bi-mode signal being set to the non-fixed clocked state during the normal, non-test mode of the device, the second bi-mode signal being set to the non-fixed clocked state so as to enter and remain in the test mode of the device; and a pair of D-type flip-flops connected to the first and second ports and configured to determine that the first bi-mode signal has been in the non-fixed clock state for at least a predetermined number of clock cycles while the second bi-mode signal has been in the fixed state and for outputting a test signal as a result thereof, wherein said device enters the test mode in response to the test signal.

2. The circuit according to claim 1, further comprising a third input port for receiving a reset signal, wherein the circuit is inhibited from outputting the test signal when the reset signal is set to an active state irrespective of state of the first and second bi-mode signals.

3. The circuit according to claim 1, wherein the predetermined number of clock transitions is three.

4. The circuit according to claim 1, further comprising a test register for receiving test data while the device is in the test mode, the test data being used to test various parts of the device.

5. The circuit according to claim 1, wherein the first input port receives an alaw_ulaw signal in the normal mode, and the second input port receives a frame synchronization signal in the normal mode.

6. A circuit for setting a device into a test mode, comprising:

a first port for receiving a first bi-mode signal, the first bi-mode signal being set to a fixed state during a normal, non-test mode of the device, the first bi-mode signal being set to a non-fixed clocked state so as to enter and remain in a test mode of the device;

a second port for receiving the second bi-mode signal, the second bi-mode signal being set to the non-fixed clocked state during the normal, non-test mode of the device, the second bi-mode signal being set to the non-fixed clocked state so as to enter and remain in the test mode of the device; and means for determining that the first bi-mode signal has been in the non-fixed clock state for at least a predetermined number of clock cycles while the second bi-mode signal has been in the fixed state and for outputting a test signal as a result thereof, wherein the device is placed in the test mode in response to the test signal.

7. The circuit according to claim 6, further comprising a third input port for receiving a reset signal, wherein the circuit is inhibited from outputting the test signal when the reset signal is set to an active state irrespective of state of the first and second bi-mode signals.

8. The circuit according to claim 6, wherein the predetermined number of clock transitions is three.

9. The circuit according to claim 6, further comprising a test register for receiving test data while the device is in the test mode, the test data being used to test various parts of the device.

10. The circuit according to claim 6, wherein the first input port receives an alaw_ulaw signal in the normal mode, and the second input port receives a frame synchronization signal in the normal mode.

11. A circuit for setting a device into a test mode, wherein the device has a first input port for receiving a first non-clocked signal during a normal operating mode of the circuit, and a second input port for receiving a first clocked signal during the normal operating mode of the circuit, said circuit comprising:

means for changing the first non-clocked signal to a second clocked signal;

means for changing the first clocked signal to a second non-clocked signal;

means for counting a number of clock periods of the second clocked signal while the second non-clocked signal is maintained at the second input port of the device; and means for placing said device into a test mode when the number of clock periods of the second non-clocked signal exceeds a predetermined number.

12. The circuit according to claim 11, further comprising:

means for detecting a change from the second non-clocked signal to the first clocked signal at the second input port of the device while the device is in the test mode, and for counting a predetermined number of clock periods of the first clocked signal after the change has occurred; and means for placing said device into the normal operating mode from the test mode when the predetermined number of clock periods is met.

13. A method of setting a device into a test mode, comprising the steps of:

receiving a first bi-mode signal which is in a fixed state to set and maintain a normal, non-test mode of the device and which is in a non-fixed clocked state so as to enter a test mode of the device;

receiving a second bi-mode signal which is in the non-fixed clocked state to set and maintain the normal mode and which is in the fixed state so as to enter the test mode;

detecting that the first bi-mode signal is in the non-fixed clocked state for at least a fixed number of clock periods;

detecting that the second bi-mode signal is in the fixed state at all times while the first bi-mode signal is in the non-fixed clocked state for at least the fixed number of clock periods; and setting the device into the test mode when the first bi-mode signal is detected to be in the non-fixed clocked state for at least the fixed number of clock periods and the second bi-mode signal is in the non-fixed clocked state for a same period of time.

14. A method of switching a device from a normal operating mode to a test mode, the device having a first input port for receiving a first non-clocked signal during a normal operating mode of the circuit, and a second input port for receiving a first clocked signal during the normal operating mode of the circuit, the method comprising the steps of:

a) changing the first non-clocked signal to a second clocked signal while the device is currently in the normal operating mode;

b) changing the first clocked signal to a second non-clocked signal while the device is currently in the normal operating mode;

c) counting a number of clock periods of the second clocked signal while the second non-clocked signal is maintained at the second input port of the device; and d) placing the device into the test mode when the number of clock periods of the second non-clocked signal exceeds a predetermined number.

* * * * *